United States Patent [19]
Chen et al.

[11] Patent Number: 5,538,592
[45] Date of Patent: Jul. 23, 1996

[54] NON-RANDOM SUB-LITHOGRAPHY VERTICAL STACK CAPACITOR

[75] Inventors: Bomy A. Chen, Dutchess County; Gary B. Bronner, Westchester County; Son V. Nguyen, Dutchess County, all of N.Y.

[73] Assignee: International Business Machines Corporation, Armonk, N.Y.

[21] Appl. No.: 279,607

[22] Filed: Jul. 22, 1994

[51] Int. Cl.[6] ............................................. H01L 21/00
[52] U.S. Cl. ............................ 156/656.1; 156/657.1; 156/655.1; 156/661.11; 437/228; 437/919
[58] Field of Search ................ 156/655.1, 657.1, 156/661.11, 656.1; 437/977, 228, 919, 52; 216/6

[56] References Cited

U.S. PATENT DOCUMENTS

| | | | |
|---|---|---|---|
| 5,061,650 | 10/1991 | Dennison et al. | 437/47 |
| 5,126,280 | 6/1992 | Chan et al. | 437/52 |
| 5,150,276 | 9/1992 | Gonzalez et al. | 437/52 |
| 5,158,905 | 10/1992 | Ahn | 437/52 |
| 5,162,248 | 11/1992 | Dennison et al. | 437/52 |
| 5,164,337 | 11/1992 | Ogawa et al. | 437/228 |
| 5,164,881 | 11/1992 | Ahn | 437/52 X |
| 5,168,073 | 12/1992 | Gonzalez et al. | 437/52 X |
| 5,204,280 | 4/1993 | Dhong et al. | 437/52 |
| 5,213,992 | 5/1993 | Lu | 437/52 |
| 5,227,322 | 7/1993 | Ko et al. | 437/47 |
| 5,231,044 | 7/1993 | Jun | 437/52 |
| 5,340,763 | 8/1994 | Dennison | 437/919 X |
| 5,416,037 | 5/1995 | Sato et al. | 437/919 X |

*Primary Examiner*—Thi Dang
*Attorney, Agent, or Firm*—Whitham, Curtis, Whitham & McGinn; Eric W. Petraske

[57] ABSTRACT

Integrated circuit structures of sub-lithography dimensions are formed by conformal deposition of alternating layers of materials having differing etch rates within an aperture over a body of material to be etched. One of the materials in the alternating layers is then selectively and preferentially etched to form a mask through which etching can be performed on the body of material to be etched. This technique is particularly suited to the formation of structurally robust capacitors for memory cells which have greatly increased plate area, resulting in increased capacitance, while maintaining a small footprint for the capacitor structure.

11 Claims, 4 Drawing Sheets

NON-RANDOM SUB-LITHOGRAPHY VERTICAL STACK CAPACITOR

BACKGROUND OF THE INVENTION

1. Field of the Invention

The present invention generally relates to the formation of integrated circuit components and, more particularly, to capacitors suitable for use in high capacity memory devices and other components which may benefit from elements formed at sub-lithography dimensions.

2. Description of the Prior Art

A principal component of all digital data processing systems is a random access memory (RAM) device. Many designs for random access memory devices are known which rely on the storage of charge in a capacitor to reflect the logic states of bits of data or instructions. Such designs are generally referred to as dynamic random access memories (DRAMs) since they must be periodically refreshed to compensate for loss of stored charge. For extreme high speed operation, high density of integration of storage cells is of paramount importance to achieve high storage capacity. At the same time, however, each memory cell must store the largest amount of charge possible, consistent with integration density in order to avoid frequently rewriting of the memory.

As is well-known, the amount of charge which can be stored at a given voltage decreases with the area of capacitor plates which can be provided. It is desirable to store as much charge as possible since all capacitor structures are subject to loss of charge through leakage and other effects. However, as integration densities have increased, the amount of space available on a chip for formation of the capacitor plates has become increasingly limited.

For this reason and because it is similarly well-known that charge storage capability can be increased with decrease in spacing between the capacitor plates and increase of the dielectric constant of insulator material placed between the plates, various geometries of so-called vertical stack capacitors have been developed in order to provide additional plate area with very thin dielectric layers between the plates within a given "foot print" on the chip. However, designs of vertical stack capacitors have been limited by the resolution of lithographic processes used to define and achieve these geometries. Therefore, the practical limits of lithography processes has been a problem in development of designs for memories having greater than 64 Mb on a single chip, even though materials of high dielectric constant have been recently developed.

Additionally, to develop complex geometries to increase capacitor plate surface area for memory cells, the number of process steps must be greatly increased. Since each step of the fabrication of semiconductor devices may be imperfectly performed, the manufacturing yield of such devices generally decreases as the number of manufacturing steps is increased.

This is also true for manufacturing steps which are used to develop surface characteristics such as hemispherical grain, rough polysilicon and the like which can significantly increase effective capacitor plate surface area and which are often collectively referred to as random surface technologies. Such random surface technologies have been virtually the only recourse to increase capacitor plate surface area for a particular lithographic resolution or minimum feature size of design rules consistent with a particular footprint area of the capacitor. While surface area can often be increased by a factor of up to about 1.5–2.0, control of the formation of such surfaces often increases the variation in capacitance between memory cells on the same chip and from chip to chip.

While the ability to store increased amount of charge in a capacitor of a limited size is especially critical in memory devices, due to the number of capacitors which may be required on a single chip, many other applications requiring capacitors and other elements in integrated circuits (e.g. isolation structures) are known which have also been limited in size and, often, in structural integrity by the resolution of the exposure tool used in lithographic processes. Therefore, a need has existed in the art for a process which is capable of forming circuit element features at smaller sizes than can be produced from particular lithographic exposure tools.

SUMMARY OF THE INVENTION

It is therefore an object of the present invention to provide a capacitor design and manufacturing technique with a reduced number of process steps and can be reliably carried out at sizes below the resolution of available photolithography processes.

It is another object of the invention to provide a vertical stack capacitor structure of increased charge storage capability within a given area of a chip.

It is a further object of the invention to provide a vertical stack capacitor structure of increased charge storage capacity without reliance on high dielectric constant materials or random surface technologies.

In order to accomplish these and other objects of the invention, a process of etching a material is provided including the steps of forming a body of material to be etched on a portion of a surface of a substrate, applying a blanket layer of a first material which is thicker than the body of material to be etched on an area of said substrate surrounding the body of material to be etched, wherein the first material has an etch rate which differs from that of the material to be etched, forming an aperture in the blanket layer to the body of material to be etched, conformally depositing alternating layers of second and third materials in the aperture, the second and third materials having respective etch rates which significantly differ from each other and at least one of the second and third materials having an etch rate similar to that of the first material, preferentially etching one of the second and third materials to form apertures to said body of material to be etched through the alternating layers of second and third materials, and selectively etching the body of material to be etched through the apertures in the alternating layers.

In accordance with another aspect of the invention, a process of forming a sub-lithography sized feature including the steps of applying a blanket layer of a first material on an area of a substrate, forming an aperture in the blanket layer of first material, conformally depositing at least three alternating layers of second and third materials in said aperture, the second and third materials having respective etch rates which significantly differ from each other and at least one of the second and third materials having an etch rate similar to that of the first material, and preferentially etching one of the second and third materials through the alternating layers of second and third materials.

BRIEF DESCRIPTION OF THE DRAWINGS

The foregoing and other objects, aspects and advantages will be better understood from the following detailed

Figure 1:
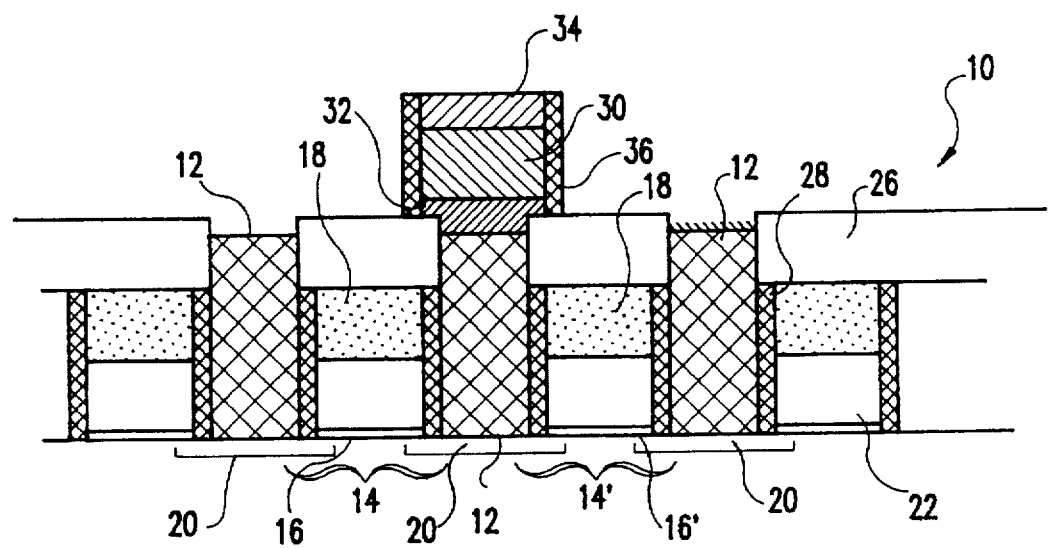
Figure 2:
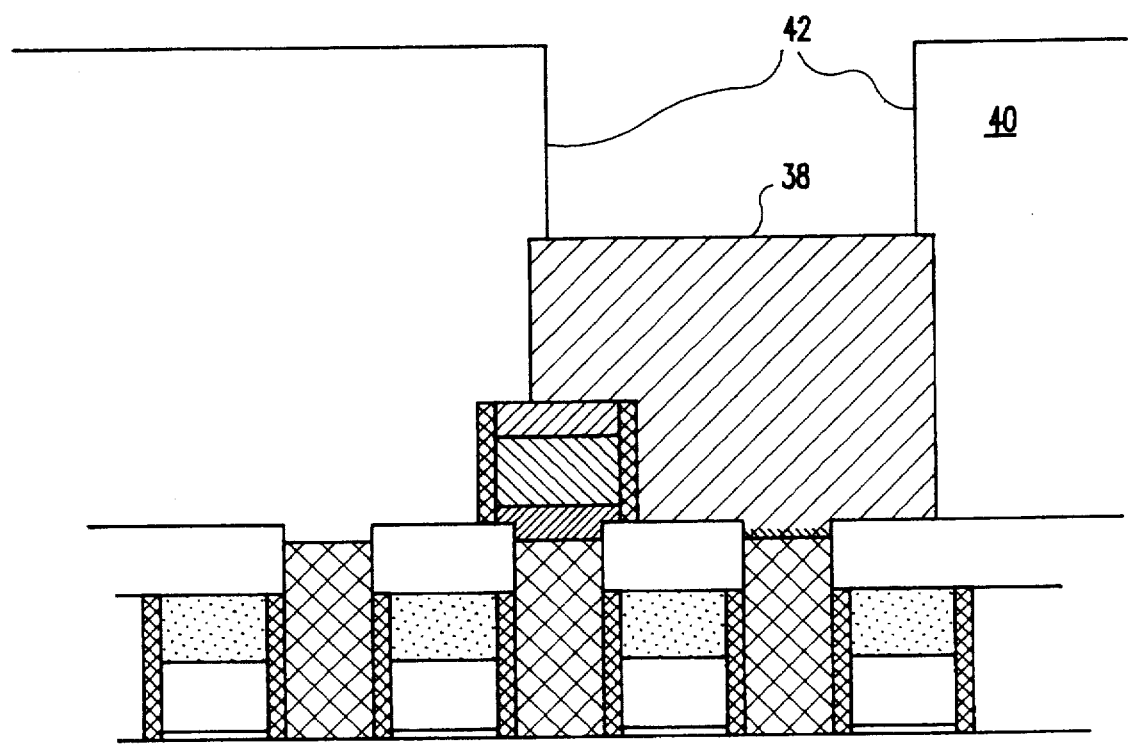
Figure 5:
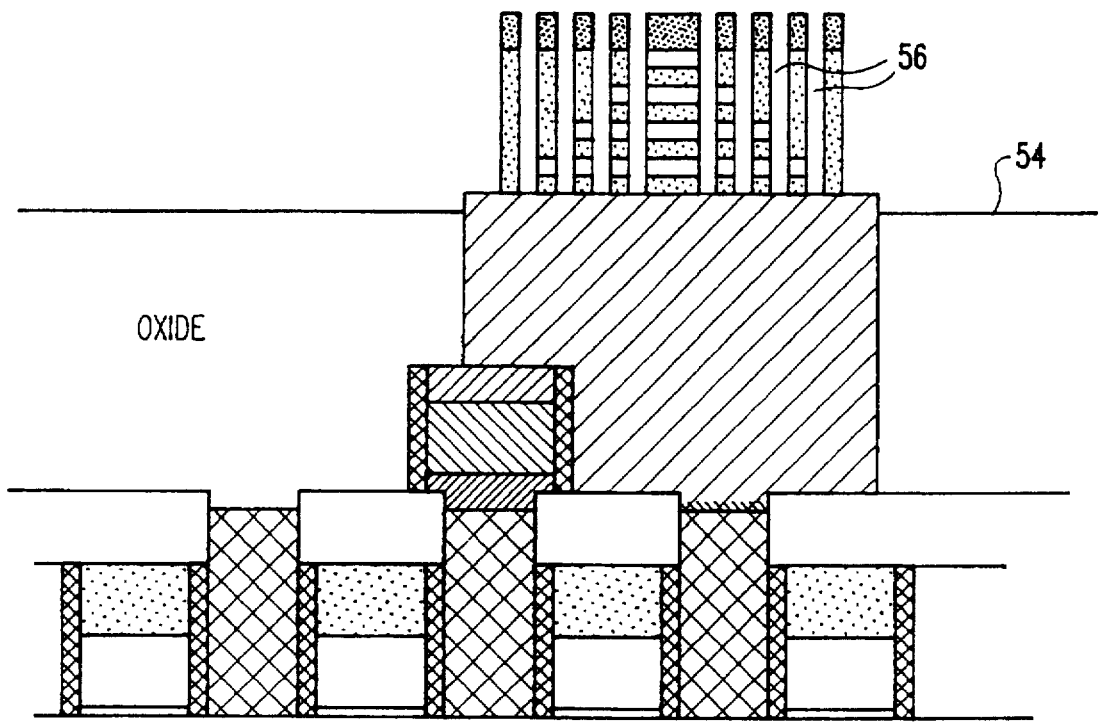
Figure 6:
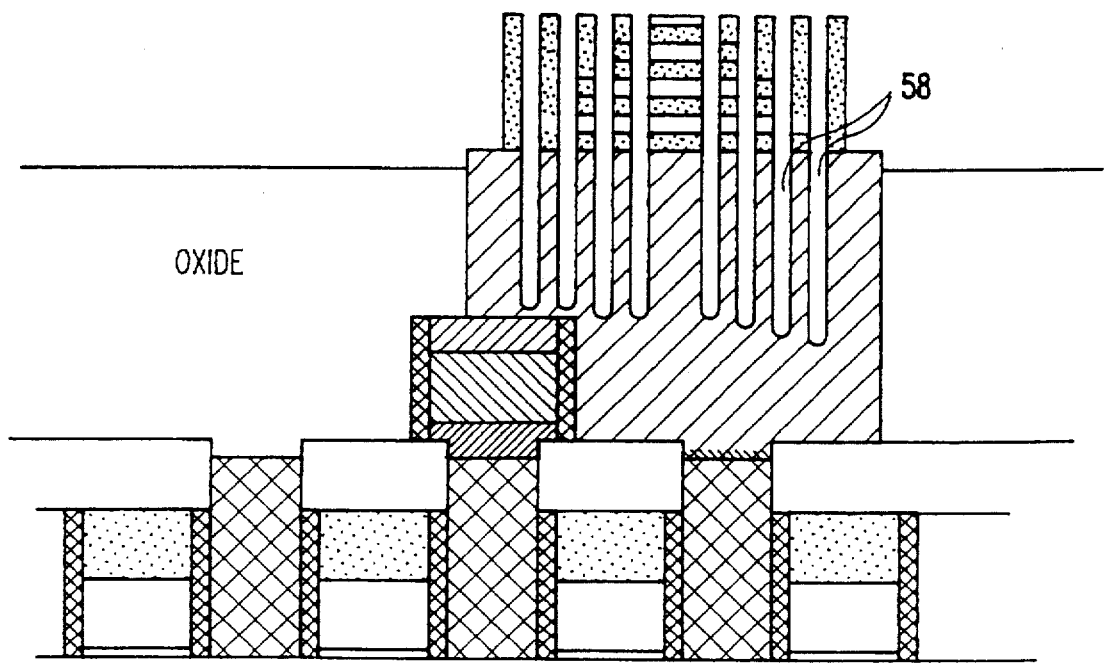
Figure 7:
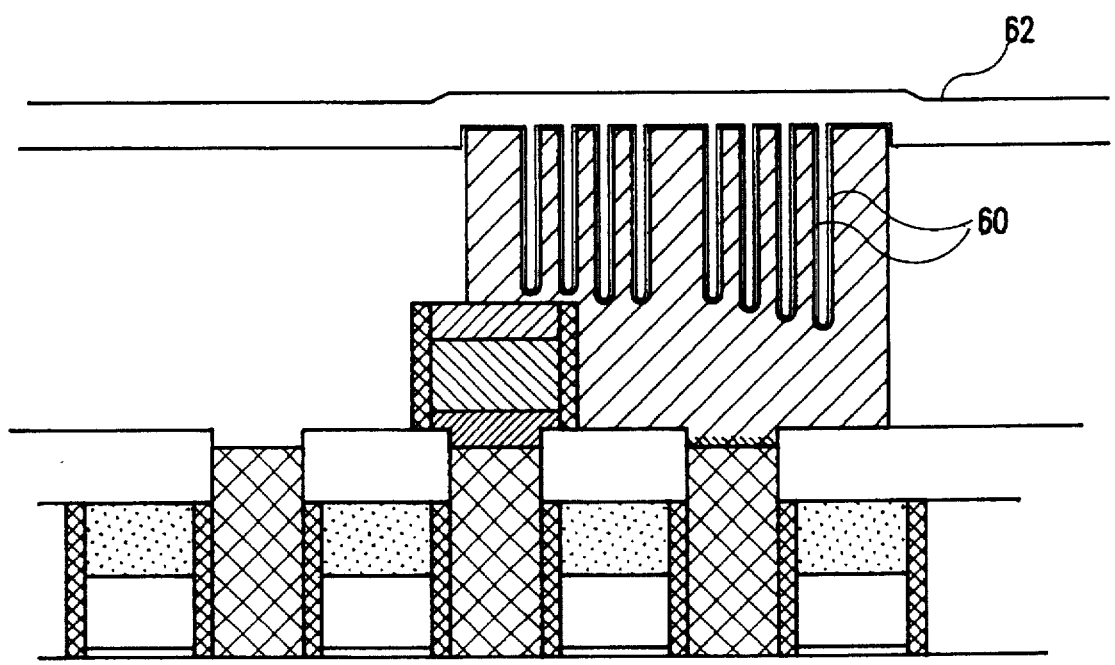

3 description of a preferred embodiment of the invention with reference to the drawings, in which:

FIG. 1 is a cross-sectional view of a substrate including an interconnect structure for accessing a cell of an integrated circuit memory prior to forming a capacitor structure in accordance with the invention, FIG. 2 is a cross-sectional view of an early stage in the formation of a capacitor structure in accordance with the invention on the interconnect structure of FIG. 1, FIGS. 3, 4, 5 and 6 are cross-sectional views of intermediate stages in the formation of a capacitor in accordance with the invention, and FIG. 7 is a cross-sectional view of a substantially completed capacitor structure in accordance with the invention.

DETAILED DESCRIPTION OF A PREFERRED EMBODIMENT OF THE INVENTION

Referring now to the drawings, and more particularly to FIG. 1, there is shown a cross-sectional view of an interconnect structure 10 such as may be found in an integrated circuit memory. While no portion of FIG. 1 is admitted to be prior art as to the present invention, the illustration of FIG. 1 generally follows an illustration found in "VLSI DRAM Technology with $Ba_{0.7}Sr_{0.3}TiO_3$ Film of 1.3 nm Equivalent $SiO_2$ Thickness and $10^{-9}$ A/cm$^2$ Leakage Current" by E. Fujii et al., Technical Digest 1992, International Electron Devices Meeting, San Francisco, Calif., Dec. 13–16, 1992, P 267, which is hereby fully incorporated by reference for a detailed discussion of this structure and which is not critical to the practice of the invention. It is to be understood that this structure is preferably formed in and/or on a substrate which is not otherwise illustrated and is to be considered as merely exemplary of one of many such interconnect structures with which the invention may be fabricated and employed to substantial advantage. It is also to be understood that the advantages provided by the invention are expected to be best exploited with designs of interconnect structures which are capable of being formed at extremely high integration densities and which may or may not resemble the depiction of FIG. 1 Nevertheless, application of the invention to any and all such interconnect structures will be entirely evident to those skilled in the art in light of the following discussion.

Specifically, the structure of FIG. 1 provides three contact studs 12 by which source/drain connections 20 of two field effect transistors 14, 14' are made. Transistors 14, 14' preferably have gate oxides 16, 16' underlying connections 18 preferably formed of tungsten silicide over a layer of polysilicon. Further connection 22 of similar construction serves as a word line. (This exemplary memory is of the so-called folded bit line type. The connection 18 on the left side of the drawing is a bit line which is connected to a memory cell either in front of or behind the plane of the cross-section, in accordance with the folded bit line layout.) These connections are insulated from the contact studs 12 by sidewall insulator structures 28 and covered by a passivation layer 26 of any suitable material such as silicon nitride. Similar insulators are provided over and on the sidewalls of bit line 30 which is connected to the contact stud at the common node of transistors 14 and 14'.

The bit line 30 is preferably either tungsten silicide or polysilicon or a combination of such materials (which are not critical to the practice of the invention) applied over the contact stud at the common node of transistors 14, 14'. A layer 32, such as polysilicon, may be applied before the bit

4 line structure is formed for selectively insulating the bit line from underlying structures except where connection is desired or for increasing adhesion. An insulating cap 34 and sidewalls 36 are also preferably provided.

As shown in FIG. 2, large polysilicon blocks or plugs 38 are formed and which can extend over a portion of the bit line 30 and the insulating cap 34 and sidewalls 32. This is preferably done by providing a thick polysilicon deposition in a blanket layer by any known process. This blanket layer is then preferably planarized and then etched to separate the layer into blocks or plugs which are in contact with the conductive stud 12 connected to transistor 14'. Once these blocks 38 are formed, an insulating layer 40 of even greater thickness is formed, preferably by a known tetra ethyl ortho silicate (TEOS) process.

This insulating layer 40 is then planarized and relatively wide openings 42 formed by lithography and oxide reactive ion etching (RIE) to the surface of polysilicon blocks 38. This results in the surface topology which is basic to the practice of the invention. It should be noted that the aperture 42 could be formed at the minimum feature size permitted by the design rules for the integrated circuit device and that, as a matter of scale, all of the structure of the vertical stack capacitor which will now be described is far smaller than the lithographic resolution required for any other part or element of the device. It should also be noted that patterning can also be performed either wholly within or overlapping aperture 42 before or after deposition of all or some of the alternating layers of materials, as will be described with reference to FIG. 3, to develop structures other than the capacitor formed in the preferred embodiment of the invention.

Figure 3:
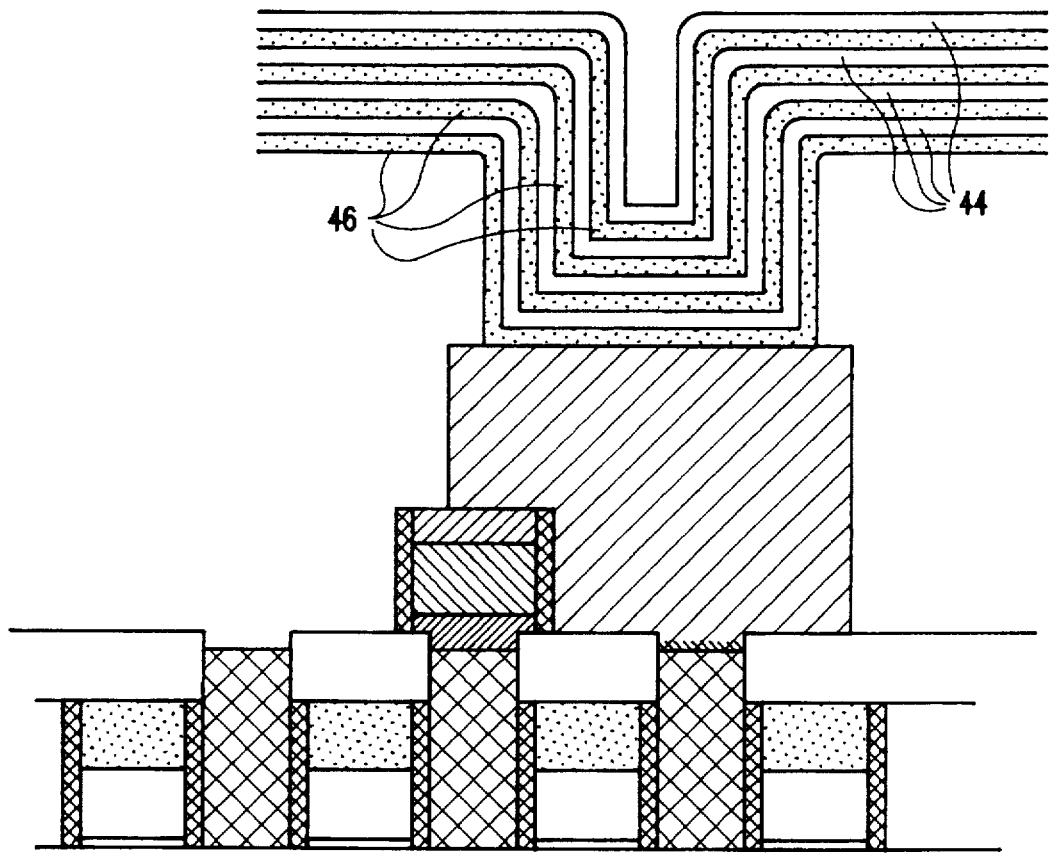

Referring now to FIG. 3, a plurality of layers 44, 46 of material are conformally deposited in sequence. This is preferably done by chemical vapor deposition and can be done in a continuous fashion in a single reactor. The materials of layers 44 and 46 are not particularly critical to the practice of the invention as long as they have much different etch rates for a particular etchant. Exemplary preferred materials are TEOS/O$_3$ for layers 44 and B$_x$Si$_x$N$_y$ for layers 46 which exhibit widely differing etch rates during hydrogen RIE so that preferential etching can be achieved. It is, however, important to note that the etch rate of the more slowly etched material (e.g. layers 44) should be comparable to the etch rate of layer 40, as is preferably achieved by using similar materials (e.g. TEOS).

Figure 4:
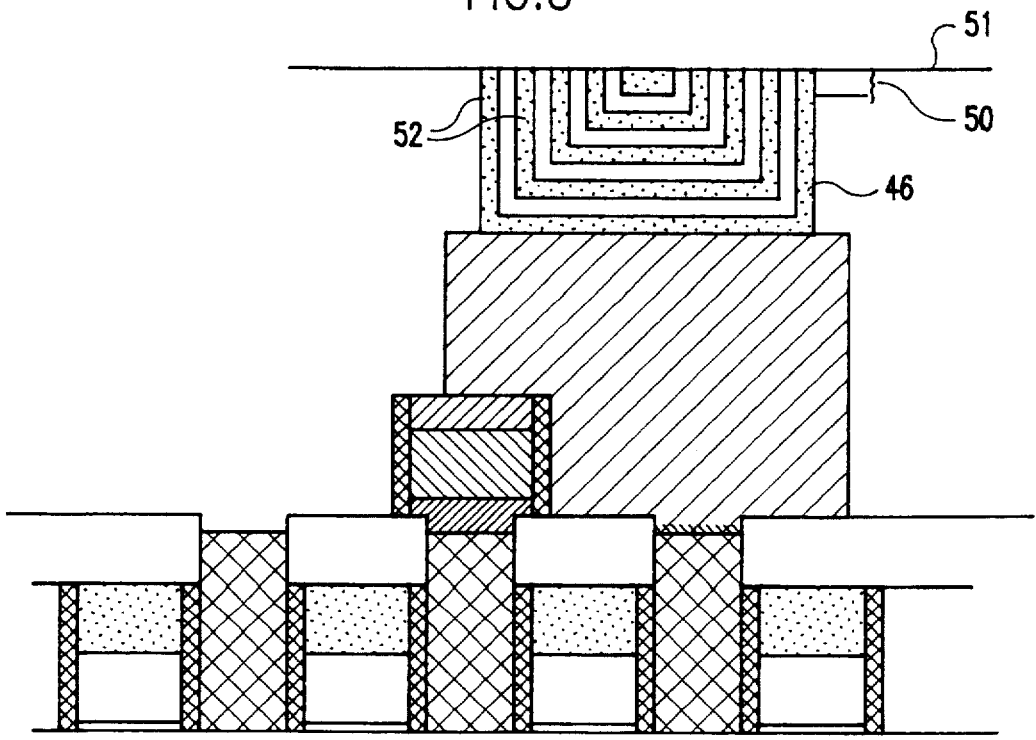

These conformally deposited layers are then planarized to the surface of the TEOS oxide layer 40 as shown in FIG. 4. It should be understood from the cross-section shown in FIG. 3 that these layers 44, 46 are basically cup-shaped and nested due to the sequential conformal deposition within aperture(s) 42. Planarization to the surface of TEOS layer 40 (which is not dimensionally critical and is preferably done by a chemical-mechanical polishing process) leaves the rim of the nested cup-shaped formations standing upright at the surface of the device.

At this point, it is preferable to selectively recess the oxide material of layers 44 which will also remove contaminants or residue from planarization which may have collected in the innermost of the cup-shaped deposited layers, at least to the depth of that cup, as indicated at dimension 50 in FIG. 4. This selective recess is preferably performed by a dry etch process or a wet etch process in hydrofluoric acid. The recessed regions are then filled with another material 52, such as polysilicon, which has a lower etch rate than the material of layers 44 under etch conditions which yield anisotropic etching of both layers 44 and 46. The material filled into the selectively recessed regions thus forms a mask of much finer resolution than could be achieved by other types of lithographic techniques. If polysilicon is used, low pressure chemical vapor deposition (LPCVD) is the preferred deposition process. The device is then again planarized to the surface 51 of layer 40.

It should be recognized at this point that, if recessing of the oxide and replacement with another material is performed, the planarized surface now comprises a pattern of concentric shapes of polysilicon or other material while the remainder of the surface is oxide (e.g. TEOS) insulator between which widely differing etch rates are easily achieved with RIE and other processes. The replacement of material to transfer the surface pattern also allows an etching process to be performed anisotropically on both layers 44 and 46 as well as on the polysilicon block 38 without structurally degrading the shapes formed from both layers. However, depending on the choice of materials for layers 44, 46 and the etching process used, the formation of the recessed polysilicon pattern may not be necessary. Further, depending on the structure to be formed and/or the electrical properties of layers 44, 46, etching of the polysilicon block 38 may not be necessary (in which case, it can be made as thin as desired) and the structure could be left substantially as shown in FIG. 5 with no further etching required.

To continue the preferred process and assuming use of the recessed polysilicon mask, anisotropically etching away of about one-half of the oxide to approximately the level of the surface of polysilicon plug 38 is performed, as shown at 54 in FIG. 5, while anisotropically etching the TEOS oxide to form grooves 56 in accordance with the polysilicon mask. Since the conformally deposited layers 44, 46 are not necessarily conductive and the preferred materials include an insulating TEOS oxide, which is layered above the conductive polysilicon block or plug 38, it is desirable to etch grooves in the conductive material of the plug in order to obtain a substantial surface area of a highly conductive capacitor plate. This requires a change of etchant or etching process at this point since the process using the polysilicon mask cannot be used to etch the polysilicon plug since any such process would attack the polysilicon mask, as well. Therefore, a dry etch process is preferably employed to anisotropically etch the plug and remove the polysilicon mask while not significantly etching the $B_xSi_xN_y$ of layers 46 or the TEOS oxide of the remaining portion of layer 40 or the oxide remaining in the conformally deposited layers.

This process results in deep grooves 58 in the polysilicon plug 38 as shown in FIG. 6. It should be noted that such etching also avoids any formation of oxide in the grooves which can cause problems at interfaces as the capacitor is completed. The remainder of the conformally deposited layers used as a mask can now be removed by planarization to result in the structure of the polysilicon plug 38 shown in FIG. 7. The grooved structure of the polysilicon plug remains surrounded with TEOS oxide and includes concentric rings which are of substantial mechanical integrity, particularly after a oxide-nitride-oxide (ONO) layer 60 of about 50 Angstroms thickness is conformally deposited in the grooves in the polysilicon plug 38 and the remainder of the grooves filled with a conductor 62 such as aluminum or polysilicon to complete the other capacitor plate. Therefore, the capacitor is of high structural strength and robustness and is resistant to damage from acceleration forces such as vibration.

The formation of interdigitated (in cross-section), nested cylindrical capacitor plates spaced from each other by extremely thin ONO insulation having a relatively high dielectric constant provides much increased capacitance as compared to former so-called crown capacitor designs, even when newly developed materials of increased dielectric constant are employed. Moreover, the depth of the grooves formed in the polysilicon plug are limited only to the thickness with which the plug 38 is formed and the capacitance may be adjusted or increased without alteration of the footprint required for formation of the capacitor.

From the foregoing, it is seen that the capacitor in accordance with the invention provides a capacitor structure having features which can be formed at sizes far below the minimum feature size of the particular lithographic process required for the remainder of the structure. The capacitor in accordance with the invention is structurally robust while having substantially increased capacitance over other, prior, designs and which does not rely on particularly high dielectric constant materials or random surface technologies which may cause variation of capacitance from cell to cell and chip to chip and/or adversely affect manufacturing yields.

The above description of the preferred embodiment of the invention is directed to the formation of a capacitor, particularly well-suited to a memory device and of greatly increased capacitor plate area and thinness of dielectric. However, it is to be understood that certain modifications of the process will be apparent to those skilled in the art for alteration of that capacitor structure for other applications or the formation of other sub-lithography features (e.g. substantially smaller than the minimum feature size of a particular lithographic patterning process or exposure tool). For example, in the capacitor described above, the layers 44, 46 are conformally deposited in an isotropic fashion but it may be possible to achieve thicker final deposition on the sidewalls of aperture 42 than on the bottom; possibly by anisotropically etching the bottom portion of each layer after a thicker conformal layer is deposited. It may also be possible to perform selective etching of one of layers 44, 46 sufficiently anisotropically that portions of layers which are more slowly etched on the bottom of aperture 42 can be etched through before the vertical portions are significantly attacked. In either case, the formation of a mask by selective recess and filling with another material such as polysilicon may not be necessary to the formation of sub-lithographic features. In other applications other than capacitors, the geometry of the sub-lithography features (e.g. in isolation trenches) themselves may allow or dictate certain similar simplifications or modifications of the above preferred process. For example, the alternating layers 44, 46 need not be concentric or even form closed curves at the surface 51 of FIG. 4 since deposition of portions of alternating layers may be avoided by masking or, once deposited, portions of such patterns can be selectively removed.

While the invention has been described in terms of a single preferred embodiment, those skilled in the art will recognize that the invention can be practiced with modification within the spirit and scope of the appended claims.

Having thus described my invention, what I claim as new and desire to secure by Letters Patent is as follows:

1. A process of etching a material including the steps of
    forming a body of material to be etched on a portion of a surface of a substrate,
    applying a blanket layer of a first material which is thicker than said body of material to be etched on an area of said substrate surrounding said body of material to be etched, said first material having an etch rate which differs from that of said material to be etched,
    forming an aperture in said blanket layer to said body of material to be etched, conformally depositing alternating layers of second and third materials in said aperture, said second and third materials having respective etch rates which significantly differ from each other and at least one of said second and third materials having an etch rate similar to said first material, preferentially etching one of said second and third materials to form apertures to said body of material to be etched through said alternating layers of second and third materials, and selectively etching said body of material to be etched through said apertures in said alternating layers.

2. A method as recited in claim 1, including, prior to said step of preferentially etching, the further steps of selectively recessing one of said second and third materials in said alternating layers to form recessed regions, filling said recessed regions with a fourth material, said fourth material having an etch rate lower than an etch rate of said material to be etched.

3. A method as recited in claim 2, wherein said material to be etched is a conductive material, said method including the further steps of forming an insulator on surfaces of etched regions of said body of material, and filling said etched regions of said body of material with a conductive material.

4. A process of forming a sub-lithography sized feature including the steps of applying a blanket layer of a first material on an area of a material to be etched, forming an aperture in said blanket layer of said first material, conformally depositing at least three alternating layers of second and third materials in said aperture, said second and third materials having respective etch rates which significantly differ from each other and at least one of said second and third materials having an etch rate similar to said first material, planarizing said at least three layers to at least a surface of said blanket layer of said first material, preferentially etching one of said second and third materials through said alternating layers of second and third materials, and etching said material to be etched.

5. A process as recited in claim 4 including, prior to said step of preferential etching, the further steps of forming a recess in at least one of said at least three layers of one of said second and third materials, and filling said recess with a fourth material.

6. A process as recited in claim 4, including the further steps of providing, prior to said conformally depositing step, a block of material located in said aperture of said blanket layer of said first material, and etching said block of material through apertures in said second and third materials which are formed by said step of preferentially etching said second and third materials.

7. A process as recited in claim 5, including the further steps of providing, prior to said conformally depositing step, a block of material located in said aperture of said blanket layer of said first material, and etching said block of material through apertures in said second and third materials which are formed by said step of preferentially etching said second and third materials.

8. A method as recited in claim 6, wherein said block of material is a conductive material, said method including the further steps of forming an insulator on surfaces of etched regions of said block of material, and filling said etched regions of said block of material with a conductive material.

9. A method as recited in claim 7, wherein said block of material is a conductive material, said method including the further steps of forming an insulator on surfaces of etched regions of said block of material, and filling said etched regions of said block of material with a conductive material.

10. A method as recited in claim 8, wherein said step of forming an insulator comprises forming a sequence of layers of oxide and nitride to form an oxide-nitride-oxide structure.

11. A method as recited in claim 9, wherein said step of forming an insulator comprises forming a sequence of layers of oxide and nitride to form an oxide-nitride-oxide structure.

* * * * *